United States Patent [19]

Oizumi et al.

[11] Patent Number: 4,521,491

[45] Date of Patent: Jun. 4, 1985

[54] FLAME-RETARDED COPPER-CLAD LAMINATE

[75] Inventors: Masayuki Oizumi, Ohtsu; Masaharu Abe, Kobe; Yasuo Fushiki, Takatsuki, all of Japan

[73] Assignee: Kanegafuchi Kagaku Kogyo Kabushiki Kaisha, Osaka, Japan

[21] Appl. No.: 572,126

[22] Filed: Jan. 18, 1984

Related U.S. Application Data

[63] Continuation of Ser. No. 326,359, Dec. 1, 1981, abandoned.

[30] Foreign Application Priority Data

Dec. 2, 1980 [JP] Japan .................................. 55-170450

[51] Int. Cl.$^3$ .............................................. B32B 15/08
[52] U.S. Cl. ..................................... 428/458; 428/480; 428/921; 428/481; 428/535; 428/537.5
[58] Field of Search ............... 427/96; 428/464, 537.5, 428/535, 901; 252/607, 609

[56] References Cited

U.S. PATENT DOCUMENTS

| | | | |
|---|---|---|---|
| 3,530,083 | 9/1970 | Hindersinn et al. | |
| 3,897,588 | 7/1975 | Nohtomi | 428/436 |
| 3,902,951 | 9/1975 | Doi et al. | 156/313 |

FOREIGN PATENT DOCUMENTS

| | | | |
|---|---|---|---|
| 153083 | 12/1975 | Japan | 428/921 |
| 4046372 | 4/1979 | Japan | 428/921 |
| 2048279 | 4/1979 | United Kingdom . | |

Primary Examiner—Marion E. McCamish
Assistant Examiner—E. Rollins Buffalow
Attorney, Agent, or Firm—Haight & Associates

[57] ABSTRACT

A flame-retarded copper-clad laminate is provided comprising a plurality of paper substrate layers each impregnated with an unsaturated polyester resin and a copper cladding adhesively bonded onto at least one side thereof.

The improvement comprises said unsaturated polyester resin containing an aliphatic and/or alicyclic brominated flame-retardant and aromatic brominated flame-retardant in combination.

12 Claims, No Drawings

FLAME-RETARDED COPPER-CLAD LAMINATE

This is a continuation of Ser. No. 326,359, filed Dec. 1, 1981, now abandoned.

BACKGROUND OF THE INVENTION

This invention relates to a flame-retarded copper-clad laminate. More particularly, it relates to such laminates made of paper substrate and unsaturated polyester resin having a copper cladding on one or both sides thereof.

Flame-retarded copper-clad laminates are widely used for safety reason in many electrical and electronic devices as printed circuit wiring boards. They are usually composed of a plurality of substrate layers each impregnated with a resin and a copper cladding foil bonded onto one or both sides thereof. However, attempts have never been made, to our best knowledge, to produce a flame-retarded copper-clad laminate from paper substrates and unsaturated polyester resins.

Only those flame-retarded, copper clad unsaturated polyester resin laminates in which a nonflammable substrate such as glass cloth is used have so far been commercialized in the United States and some other countries. In cases where the substrate is nonflammable, it is easy to select an adequate, flame-retarded, unsaturated polyester resin, since said resin has only to be flame-retarded by itself. Thus, in most cases, reactive flame retardants containing aromatic bromine, such as tetrabromophthalic anhydride, are used as a saturated dibasic acid component for the production of polyesters.

However, when a resin of that kind is used in producing paper-based copper-clad laminates, the laminates can by no means be self-extinguishing because the paper substrate is inflammable. Therefore, it becomes necessary to increase the bromine content by increasing the amount of said reactive flame retardants and/or by adding non-reactive aromatic bromine compounds.

Investigations made by the present inventors have revealed that, for obtaining flame-retarded paper/polyester copper-clad laminates which can meet the requirements under UL-94 VO, for instance, the aromatic bromine content in the unsaturated polyester resin should be at least 30 percent by weight. The mechanical strength and copper foil peel strength of the laminate obtained were only slightly deteriorated by heating, for example at 100° C. to 170° C.

However, aromatic bromine contents exceeding 30 percent by weight not only increase the cost of production of the laminate but also unfavorably cause rapid decrease in tracking resistance. It is well known that halogen compounds such as bromine compounds and chlorine compounds, phosphorus compounds, antimony trioxide and the like may be used as flame retardants for unsaturated polyester resins. Among them, bromine compounds are most effective.

Generally, flame retardant bromine compounds may be classified roughly into the following five groups:

(1) Aromatic bromine compounds having, for example, by the formula:

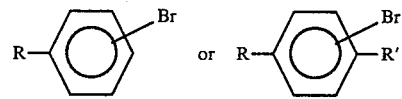

wherein R, and R' each means a hydrocarbon substituent;

(2) Aliphatic bromine compounds represented, for example, by the formula:

wherein the bromine is bonded to a primary carbon atom;

(3) Aliphatic bromine compounds represented, for example, by the formula:

wherein the bromine atom is bonded to a secondary carbon atom;

(4) Aliphatic bromine compounds represented, for example, by the formula:

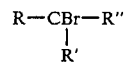

wherein the bromine atom is bonded to a tertiary carbon atom; and (5) Alicyclic bromine compounds represented, for example, by the formula:

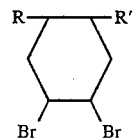

When evaluated as flame retardants, compounds (2)-(5) are more effective than compounds (1); compounds (3) are more effective than compounds (2); compounds (4) are more effective than compounds (3); and compounds (3) and compounds (5) are comparable to each other.

Attempts have been made by us to use compounds (5) as flame retardant for paper/polyester copper-clad laminates. As a result, it has been found that, at a bromine content in the resin of 20 percent by weight or less, the resultant laminates meet the requirements of the UL standard UL-94 VO. Regretably, however, whereas those laminates were excellent in fire resistance and tracking resistance, heating at high temperatures, for example at 100°-170° C., resulted in marked deterioration of mechanical strength, discoloration of copper foil, and/or remarkable decrease in copper foil peel strength. Said laminates were thus inadequate with respect to heat stability.

DESCRIPTION OF THE INVENTION

Under these circumstances, the present inventors have been engaged in intensive research works in the provision of flame retarded paper/unsaturated polyester copper-clad laminates which are not only flame retardant but also thermally stable and moreover are excellent in tracking resistance and inexpensive. We have now found that a combined use of the above-mentioned compound (1) and at least one of compounds (2)–(5) yields dramatically improved products. This finding has led to the present invention.

Herein the present specification, that bromine which is contained in any of compounds (1) is referred to as "aromatic bromine", that bromine which is contained in any of compounds (2)–(4) as "aliphatic bromine", and that bromine which is contained in any of compounds (5) as "alicyclic bromine".

According to the present invention, a flame retarded paper/polyester copper-clad laminate is provided comprising a plurality of paper substrate layers each impregnated with an unsaturated polyester resin and a copper cladding adhesively bonded onto one or both sides thereof. The improvement resides in the fact that said unsaturated polyester resin contains an aliphatic and/or alicyclic brominated flame retardant and an aromatic flame retardants in combination.

The unsaturated polyester resin to be used in the practice of the present invention includes among others:

(1) Well-known bromine-free unsaturated polyester resin compositions, wherein the unsaturated polyester chain is derived from a polyhydric alcohol, such as, for example, ethylene glycol, propylene glycol, diethylene glycol, 1,4-butanediol, 1,5-pentanediol, dipropylene glycol or triethylene glycol, the unsaturated polybasic acid constituent is, for example, maleic anhydride, fumaric acid, citraconic acid or itaconic acid, and a saturated dibasic acid, such as, for example, phthalic anhydride, isophthalic acid, terephthalic acid, adipic acid, sebacic acid or azelaic acid, and wherein a crosslinking monomer, such as, for example, styrene, which is preferred, alpha-methylstyrene, vinyltoluene, chlorostyrene, divinylbenzene, a $C_{1-10}$ alkyl acrylate, a $C_{1-10}$ alkyl methacrylate, diallyl phthalate or triallyl cyanurate, is blended;

(2) Unsaturated polyester resin compositions which comprise an unsaturated polyester chain containing aromatic bromine in the principal chain thereof, such as a polycondensation product produced by the use of tetrabromophthalic anhydride, for instance, as a saturated dibasic acid, or tetrabromobisphenol A ethylene oxide adduct, for instance, as a polyhydric alcohol, and a crosslinking monomer;

(3) Unsaturated polyester resin compositions which comprise an unsaturated polyester chain containing aliphatic bromine in the principal chain thereof, such as one produced by the use of dibromoneopentyl glycol, for instance, as a polyhydric alcohol, and a crosslinking monomer;

(4) Unsaturated polyester resin compositions which comprise a polyester containing alicyclic bromine in the principal chain thereof, such as one produced by the use of tetrahydrophthalic anhydride, for instance, as a saturated dibasic acid, and by the subsequent addition of bromine (see, for example, Japanese Patent Publication No. 71-8993), and a crosslinking monomer;

(5) Mixtures of (1)–(4);

(6) Unsaturated polyester resin compositions (1)–(5) wherein the crosslinking monomer is a bromine compound, such as bromostyrene, brominated phenyl methacrylate or brominated phenyl acrylate;

(7) Unsaturated polyester resin compositions (1)–(6) which contain any of various flame retardants containing aliphatic, alicyclic and/or aromatic bromine, such as brominated polyphenyl, tetrabromobutane, tetrabromoethane, 1,2,3-tribromopropane, hexabromocyclododecane, tetrabromobenzene, tetrabromophthalic anhydride, tetrabromobisphenol A, bromine-containing polyol, tris(2,3-dibromopropyl)phosphate, chloropentabromocyclohexane, brominated diphenyl ether, pentabromophenyl allyl ether and bromoalkenyl ether. By using these compositions combinedly or mixedly, there can be obtained unsaturated polyester resin compositions that contain aliphatic bromine and/or alicyclic bromine as well as aromatic bromine. The unsaturated polyester resin to be used may be either liquid or solid at room temperature. When the resin is liquid, paper substrate is impregnated with the resin as it is. When solid, the resin is melted by heating, and paper is impregnated with the molten resin. The resin may also be dissolved in a solvent, and paper substrate is impregnated with the resultant varnish and then dried. Generally, a plurality of sheets of such resin-impregnated paper are superposed, and further a coper foil is laminated thereto to form a copper-clad laminate. Various methods are known in the art for producing metal clad reinforced resin laminates.

Especially when the unsaturated polyester resin is liquid at room temperature, the continuous production method already proposed by the present inventors in Japanese Patent Application No. 80-1,020 can preferably be employed.

Furthermore, those resins which, when cured, show a glass transition temperature of 30° C. to 100° C. are preferred because of good punching quality. Those resins which, when cured, show a Rockwell hardness of M 85 to M 110 are also preferred for the same reason. Resins curable by radical polymerization, such as diallyl phthalate resin and vinyl ester resins, may also be used in place of or in admixture with the above-mentioned unsaturated polyester resins if the resin compositions meet the bromine composition requirement in accordance with the invention.

The term "paper substrate" as used herein includes papers predominantly composed of cellulosic fiber, such as kraft paper, linter paper and cotton paper, preferably having a basis weight of 100 to 200 g/m² and a density of about 0.3 to 0.7 g/cm³.

The copper foil to be used in the practice of the present invention is most preferably an electrolytic copper foil of a grade of about ¼ oz/ft² to 2 oz/ft², which is commercially available generally for use as a printed circuit wiring board stock material.

In a preferred embodiment of the present invention, the sum of the aliphatic bromine and/or alicyclic bromine contained in the unsaturated polyester resin amounts to 1 to 12 percent by weight, the aromatic bromine content is 5–25 percent by weight, and the total bromine content is not more than 30 percent by weight. For obtaining preferable bending strength and impact resistance, the weight ratio of paper substrate to unsaturated polyester resin is generally 7:3 to 2:8, preferably 6:4 to 2:8. It is thus necessary to inhibit combustion of the paper substrate present in said amount by means of bromine contained in the above-mentioned resin or resin composition.

When paper is present in such a weight ratio, a content of aliphatic bromine and/or alicyclic bromine of less than 1 percent by weight will fail to provide satisfactory flame retardance, whereas a content exceeding 12 percent by weight will impair thermal stability such as mentioned above. On the other hand, an aromatic bromine content of less than 5 percent by weight will be insufficient for adequate flame retardance, whereas an aromatic bromine content exceeding 25 percent by weight will cause deterioration of tracking resistance or make the product much expensive. When the total bromine content exceeds 30 percent, tracking resistance will be much deteriorated.

More preferably, the unsaturated polyester resin contains 2-8 percent by weight of aliphatic bromine and/or alicyclic bromine, and 5-25 percent by weight of aromatic bromines, the total bromine content being not more than 27 percent by weight.

As the aliphatic bromine and/or alicyclic bromine, preferred are compounds (3) or (5) mentioned above. However, no particular limitation is placed on the weight ratio relative to bromine among compounds (2) to (5), and any combination may be used.

As compounds (3)-(5), preferred are those compounds which provide bromine directly bonded chemically to the unsaturated polyester resins chain, or which serve as crosslinking monomers, as compared with additive-type ones, because the former give better flame retardance and mechanical properties.

Copper-clad laminates for use as printed circuit boards are required to have good moisture resistance. For this reason, it is preferable to strengthen the bonding between the cellulose fiber and the unsaturated polyester resin in accordance with the invention. Thus, for instance, for improving the solder dip resistance after exposure to moisture, it is preferable to interpose between the cellulose fiber and unsaturated polyester resin a composition predominantly composed of a methylol compound, preferably an N-methylol compound. There can adequately be used a variety of methylol compounds, such as phenol-formaldehyde resins obtainable by reaction of a phenol with formalin in the presence of an acid or alkali as catalyst, and N-methylol compounds obtainable by addition condensation of formalin to an amino or amido group.

Examples of the N-methylol compound are urea resin, cyclic urea resin, melamine resin, guanamine resin, and N-methylolacrylamide.

These methylol compounds may be used each alone or as a mixture of two or more of them. Furthermore, in the practice of the present invention, any of those third components which have been proposed by the present inventors in Japanese Patent Applications Nos. 79-121,180, 80-128,935, 80-128,936, 80-128,937 and 80-128,938 may be used. Thus a composition predominantly composed of a methylol compound, preferably an N-methylol compound, which contains as mechanical property modifier an epoxy resin or higher fatty acid derivative (e.g. oleic acid monoglyceride), for instance, incorporated therein by condensation or mixing may be used with advantage. (Hereinafter, the term "methylol compound" may also include such mixture and/or condensate of the methylol compound with a modifier such as mentioned above). The methylol compound is preferably present in an amount of 5-30 percent by weight, preferably 10-20 percent by weight, based on the weight of paper. For that purpose, it is preferable that a composition predominantly composed of the above compound is dissolved or suspended in water, methanol, a mixture of water and methanol, or other solvent and paper is impregnated with the solution or suspension and then dried.

In accordance with a further aspect of the invention, the above-mentioned methylol compound may contain the above-mentioned aliphatic bromine and/or alicyclic bromine and aromatic bromine. In that case, the aliphatic bromine and/or alicyclic content based on the total weight of the composition predominantly composed of the above-mentioned compound and the unsaturated polyester resin is 1-12 percent by weight, and the aromatic bromine content on the same basis is 5-25 percent by weight, the total bromine content being not more than 30 percent by weight. Preferably, the aliphatic bromine and/or alicyclic bromine content is 2-8 percent by weight, and the aromatic bromine content is 5-25 percent by weight, the total bromine content being not more than 27 percent by weight.

In accordance with a further aspect of the invention, the above-mentioned paper/unsaturated polyester copper-clad laminate may also contain one or more of other flame retardants, often with success.

Usable are, for example, halides other than bromides, such as chlorine-containing unsaturated polyester resins derived from chlorendic (or HET) acid or the like, chlorinated paraffins, chlorinated polyethylene, chlorinated polyphenyl, perchloropentacyclodecane, chlorinated biphenyl, vinyl chloroacetate, chlorendic acid diallyl ester, tetrachlorophthalic anhydride, chloropropanediol, and chlorostyrene, and phosphorus compounds, such as tricresyl phosphate, cresyl diphenyl phosphate, triphenyl phosphate, diphenyl octyl phosphate, tributyl phosphate, tris(2-chloroethyl)phosphate, tris(dichloropropyl)phosphate, tris(bromochloropropyl)phosphate, trimethyl phosphate, triethyl phosphate, trioctyl phosphate, trixylenyl phosphate, octyl diphenyl phosphate, dibutyl phosphate, and monobutyl phosphate.

The use thereof may often result in improvement in glowing. Furthermore, addition of about 2-7 parts of antimony trioxide often makes it possible to decrease the amount of the total bromine content in the above-mentioned resin to 15 percent by weight or less.

For strengthening the adhesion of the copper foil, it is preferable to form a 5 to 150-micron-thick adhesive layer on the copper foil and thereby effect lamination of the copper foil by means of the adhesive.

The adhesive may also be flame-retarded. However, if the adhesive is not flame-retarded, it is preferable that the thickness of the adhesive layer is 5-100 microns. If the thickness of the non-retarded adhesive layer is more than 100 microns, the adhesive layer may burn, rendering the product laminate non-self-extinguishing.

Suitable adhesives are epoxy resin type ones, more preferably bisphenol A type ones. As the curing agent therefor, there may be used any of conventional amines, such as aliphatic amines and aromatic amines. Polyamide resins, terminal amino-containing polybutadiene nitrile rubber and the like may also be used as adequate curing agents for the above purpose. Mixtures of the above-mentioned curing agents are also usable.

As the catalyst for curing the unsaturated polyester resin to be used in the practice of the invention, a peroxide is generally employed, for example, a peroxydicarbonate, a ketone peroxide, a hydroperoxide, a diacyl peroxide, a peroxyketal, a dialkyl peroxide, or a peroxy ester. Especially when an epoxy type adhesive is used, an adequate peroxide as catalyst for curing can successfully be selected from the group consisting of a peroxyketal, a peroxy ester, a dialkyl peroxide, and mixtures thereof.

Examples of the peroxyketal are 1,1-bis(tert-butyl-peroxy)-3,3,5-trimethylcyclohexane, 1,1-bis(tert-butyl-peroxy)-cyclohexane and n-butyl 4,4-bis(tert-butyl-peroxy)valerate. Di-ter-butyl peroxide and 2,5-dimethyl-2,5-bis(tert-butyl-peroxy)hexyne-3 are examples of the dialkyl peroxide. The peroxy ester includes among others tert-butyl peroxy-acetate, tert-butyl peroxy-2-ethylhexanoate, tert-butyl peroxylaurate and tert-butyl peroxybenzoate.

The above-mentioned peroxides do not inhibit curing of the epoxy resin used as adhesive but give good results.

The use of such peroxides is effective especially when both the unsaturated polyester resin and epoxy adhesive are in incompletely cured state at the lamination and adhesion step.

As described hereinbefore, the present invention provides a copper clad laminate which is composed of paper substrate and an unsaturated polyester resin and has good heat stability and flame-retardance together with other satisfactory characteristics. The technical advance achieved by the invention will become apparent from the following examples.

The following examples are given by way of illustration and not by way of limitation. All parts and percents therein are by weight.

EXAMPLE 1

A flame-retarded alicyclic bromine-containing unsaturated polyester resin (FMS 583, Nippon Yupika Co., Ltd.) (20 parts), a non-brominated unsaturated polyester resin (POLYMAL 6305, Takeda Chemical Industries, Ltd.) (80 parts), brominated diphenyl ether (bromine content 64%) (45 parts), tricresyl phosphate (4 parts), and PERHEXA 3M (Nippon Oil and Fat Co., Ltd.) (1 part) were admixed to give a flame-retarded resin composition. Separately, kraft paper preimpregnated with a melamine resin (S-305, Nippon Carbide Industries Co., Ltd.) and oleic acid monoglyceride (RIKEMAL OL-100, Riken Vitamin Oil Co., Ltd.), with basis weight of 150 g/m² and a thickness of 285 microns, was impregnated with the above resin composition. A total of 5 sheets of so impregnated kraft paper were superimposed. Then, a 35-micron-thick electrolytic copper foil coated on one side with an epoxy-type adhesive composed of 70 parts of EPIKOTE 828 (Shell Chemical Co.) and 30 parts of VERSAMID 125 (Henkel Japan Limited) and a 35$\mu$ thick cellophane film were further laminated with the above assembly from the respective sides. The entire laminate was heated in an air oven at 110° C. for 30 minutes. For a further curing reaction, the laminate was heat-treated at 100° C. for 10 hours to give a copper-clad laminate having a thickness of 1.6 mm. The results of tests performed on this laminate are shown below in the Table.

EXAMPLE 2

A flame-retarded resin composition was prepared by admixing 20 parts of an alicyclic bromine-containing unsaturated polyester resin (FMS 583), 60 parts of a bromine-free unsaturated polyester resin (POLYMAL 6305), 20 parts of a bromine-free polyester resin (POLYMAL 6320F), 25 parts of brominated diphenyl ether (bromine content 64%), 3 parts of tricresyl phosphate, 3 parts of antimony trioxide, and 1 part of PERHEXA 3M. Using this composition, a copper-clad laminate having a thickness of 1.6 mm was produced by the procedure of Example 1. The results of tests performed on this laminate are shown below in the Table.

COMPARATIVE EXAMPLE 1

A resin composition was prepared by admixing 70 parts of an alicyclic bromine-containing unsaturated polyester resin (FMS 583), 24 parts of a halogen-free unsaturated polyester resin (POLYMAL 6320F), 6 parts of styrene, 3 parts of tricresyl phosphate, and 1 part of PERHEXA 3M, and a copper-clad laminate having a thickness of 1.6 mm was produced by the procedure of Example 1. The results of tests performed on this laminate are shown below in the Table.

COMPARATIVE EXAMPLE 2

A resin composition was prepared from 100 parts of a halogen-free unsaturated polyester resin (POLYMAL 6305), 100 parts of brominated diphenyl ether (bromine content 64%), and 1 part of PERHEXA 3M, and a copper-clad laminate having a thickness of 1.6 mm was produced by the procedure of Example 1. The results of tests performed on this laminate are shown below in the Table.

COMPARATIVE EXAMPLE 3

An aromatic bromine-containing flame-retarded unsaturated polyester resin was prepared by admixing 100 parts of an unsaturated polyester prepared from 2 moles of tetrabromobisphenol A-ethylene oxide adduct, 1 mole of diethylene glycol, 1 mole of maleic anhydride, and 2 moles of isophthalic acid, 30 parts of styrene (as crosslinking monomer) and 15 parts of brominated phenyl methacrylate (as crosslinking monomer; bromine content 58%). To 100 parts of said resin was added 1 part of PERHEXA 3M to give a resin composition. Using the resin composition, a copper-clad laminate having a thickness of 1.6 mm was produced by the procedure of Example 1. The results of tests performed on this laminate are shown below in the Table.

| | Example 1 | Example 2 | Comparative Example 1 | Comparative Example 2 | Comparative Example 3 | Testing method |
|---|---|---|---|---|---|---|
| Aliphatic bromine or alicyclic bromine content in unsaturated polyester resin, percent by weight | 3.1 | 3.5 | 15.5 | 0 | 0 | |
| Aromatic bromine content in unsaturated polyester resin, percent by weight | 19.2 | 12.1 | 0 | 31.8 | 31.6 | |
| Total bromine content in unsaturated polyester resin, percent by weight | 22.3 | 15.6 | 15.5 | 31.8 | 31.6 | |
| Weight ratio of paper to resin | 35/65 | 35/65 | 35/65 | 35/65 | 35/65 | |
| Flammability | $V_0$ | $V_0$ | $V_0$ | $V_1$ | $V_0$ | UL 94 |
| Copper foil peel | 1.40~1.47 | 1.42~1.53 | $\leqq 0.2$ | 0.80~0.94 | 1.12~1.33 | UL 796 |

-continued

|  |  | Example 1 | Example 2 | Comparative Example 1 | Comparative Example 2 | Comparative Example 3 | Testing method |
|---|---|---|---|---|---|---|---|
| strength after heat treatment at 150° C. for 10 days, kg/cm |  |  |  | Foaming |  |  |  |
| Bending strength, kg/mm$^2$ | Lengthwise | 1.48 | 1.57 | 1.38 | 0.76 | 1.50 | JIS C-6481 |
|  | Crosswise | 1.38 | 1.49 | 1.32 | 0.71 | 1.43 |  |
| Bending strength retention (170° C. × 10 days), % | Lengthwise | 85 | 82 | 45 | 91 | 82 | JIS C-6481 |
|  | Crosswise | 88 | 86 | 41 | 90 | 87 |  |
| Dielectric breakdown strength retention (170° C. × 10 days), % |  | 114 | 119 | 85 | 105 | 98 | UL 746 A |
| Volume resistivity, Ω · cm |  | $2.6 \times 10^{15}$ | $1.1 \times 10^{15}$ | $4.3 \times 10^{14}$ | $9.0 \times 10^{14}$ | $2.0 \times 10^{15}$ | JIS C-6481 |
| Tracking resistance (CTI), V |  | 550 | 600 | 550 | 350 | 450 | UL 746 A |
| Water absorbing capacity E-24/50 + D-24/23, % |  | 0.54 | 0.57 | 0.55 | 0.64 | 0.60 | JIS C-6481 |
| Punching property at 50–60° C. |  | ◉ | ◉ | ○ | Δ Whitening | X | See Note |

Note: The punching property was evaluated by the use of a test die having 23 holes (1 mm in diameter) arranged at 2.54 mm intervals.
◉ Excellent
○ Very Good
Δ Good
X Poor The above has been offered for illustrative purposes only, and it is not for the purpose of limiting the scope of this invention, which is defined in the claims below.

We claim:

1. In a flame-retarded copper-clad laminate suitable for use as a printed circuit board comprising a plurality of cellulosic fiber paper substrate layers each impregnated with an unsaturated polyester resin and a copper cladding adhesively bonded to at least one side thereof, the improvement wherein the unsaturated polyester resin contains:
   (a) 1 to 12% by weight of bromine attached to an aliphatic and/or alicyclic backbone component of said unsaturated polyester resin;
   (b) 5 to 25% by weight of bromine attached to an aromatic backbone of said resin and/or attached to an aromatic flame retardant admixed with said unsaturated polyester resin; and
   (c) the total bromine content not exceeding 30% by weight of the laminate.

2. The flame-retarded laminate of claim 1, wherein said aliphatic and/or alicyclic bromine content is 2 to 8% by weight and said aromatic bromine content is 5 to 25% by weight, the total bromine content not exceeding 27% by weight.

3. The flame-retarded laminate of claim 1, wherein said paper substrate has a coating derived from a methylol group-containing compound.

4. The flame-retarded laminate of claim 3, wherein said methylol group-containing compound is an N-methylol compound.

5. The flame-retarded laminate of claim 3, wherein said coating also contains said aliphatic and/or alicyclic flame retardant and an aromatic flame retardant in combination, the amounts of which being such that the content of aliphatic and/or alicyclic bromine is 1 to 12% by weight and the content of aromatic bromine is 5 to 25% by weight, the total bromine content not exceeding 30% by weight, all being based on the weight of said methylol group-containing compound plus said unsaturated polyester resin.

6. The flame-retarded laminate of claim 5, wherein said aliphatic and/or alicyclic bromine content is 2 to 8% by weight and said aromatic bromine content is 5 to 25% by weight, the total bromine content not exceeding 27% by weight.

7. The flame-retarded laminate of claim 3, wherein said coating further comprises as auxiliary flame retardant a fluorinated or chlorinated flame retardant, or a phosphorus-containing flame retardant, or antimony trioxide.

8. The flame-retarded laminate of claim 1, wherein said unsaturated polyester resin further comprises as auxiliary flame retardant a fluorinated or chlorinated flame retardant, a phosphorus-containing flame retardand, or antimony trioxide.

9. The flame-retarded laminate of claim 1, wherein an adhesive layer of 5 to 150 micron thick is present at the interface between said cladding and said layers of resin impregnated paper substrates.

10. The flame-retarded laminate of claim 9, wherein said adhesive is an epoxy resin.

11. The flame-retarded laminate of claim 1, wherein said unsaturated polyester resin is a peroxide-catalysed thermoset resin.

12. The flame-retarded laminate of claim 11, wherein said peroxide is selected from the group consisting of a peroxyketal, a peroxy ester and a dialkyl peroxide.

* * * * *